US005573980A

United States Patent [19]
Yoo

[11] Patent Number: 5,573,980
[45] Date of Patent: Nov. 12, 1996

[54] METHOD OF FORMING SALICIDED SELF-ALIGNED CONTACT FOR SRAM CELLS

[75] Inventor: Chue-San Yoo, Hsin-Chu, Taiwan

[73] Assignee: Taiwan Semiconductor Manufacturing Company Ltd., Hsin-Chu, Taiwan

[21] Appl. No.: 583,917

[22] Filed: Apr. 22, 1996

[51] Int. Cl.$^6$ ................................................ H01L 21/28
[52] U.S. Cl. ........................................ 437/200; 437/192
[58] Field of Search ................................ 437/192, 193, 437/195, 200

[56] References Cited

U.S. PATENT DOCUMENTS

| | | | |
|---|---|---|---|
| 4,458,410 | 7/1984 | Sugoki et al. | 437/200 |
| 4,966,868 | 10/1990 | Muroli et al. | 437/200 |
| 5,045,494 | 9/1991 | Choi et al. | 437/193 |
| 5,480,814 | 1/1996 | Wuu et al. | 437/193 |

OTHER PUBLICATIONS

"Silicon Processing for the VLSI Era", vol. 2, by S. Wolf, Lattice Press, Sunset Beach, CA, 1990, pp. 144–149.
"VLSI Technology" Second Edition, by S M Sze, McGraw Hill, New York, NY 1988, pp. 397–400 and 479–483.

*Primary Examiner*—John Niebling
*Assistant Examiner*—Thomas G. Bilodeau
*Attorney, Agent, or Firm*—George O. Saile; Larry J. Prescott

[57] ABSTRACT

This invention provides a method of forming very low resistance self-aligned silicide contacts to devices formed in a silicon integrated circuit substrate while avoiding the formation of stringers or stray silicide conductor paths. The method uses a thin layer of polysilicon which is patterned so as to only cover the contact region of the device being contacted. A layer of metal such as titanium is then deposited and the silicide is formed using rapid thermal annealing. The unreacted metal is then etched away. The primary application is to form a low resistance $V_{ss}$ plate for adjacent pull down transistors in SRAM cells but can be used in any device requiring a low resistance contact to silicon.

19 Claims, 4 Drawing Sheets

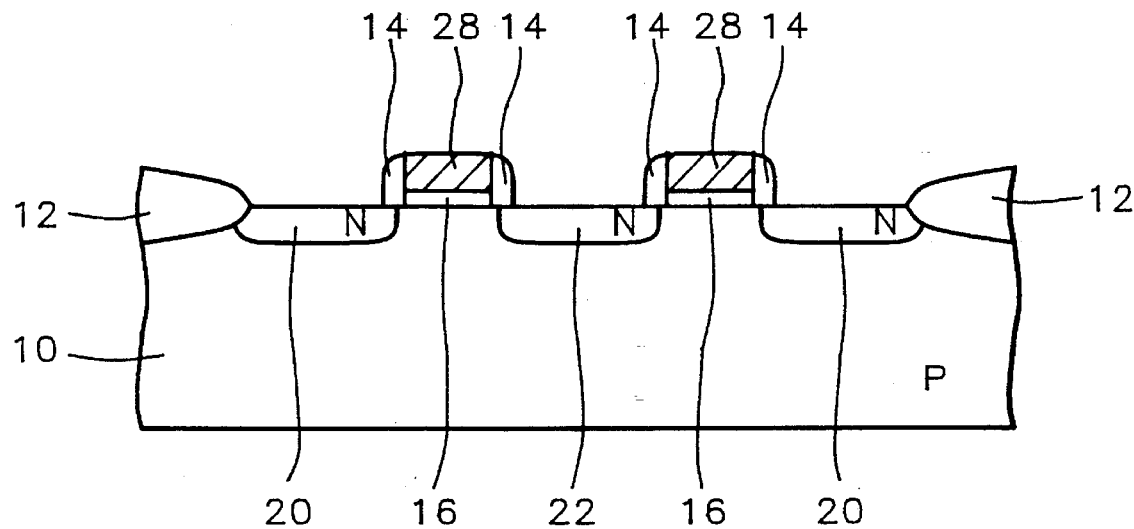
FIG. 1A – Prior Art
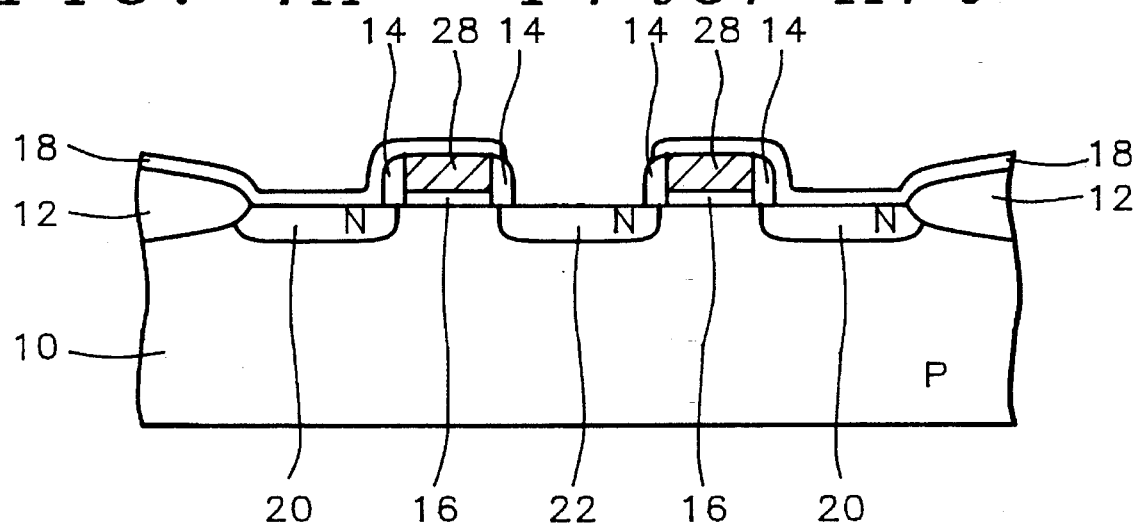
FIG. 1B – Prior Art
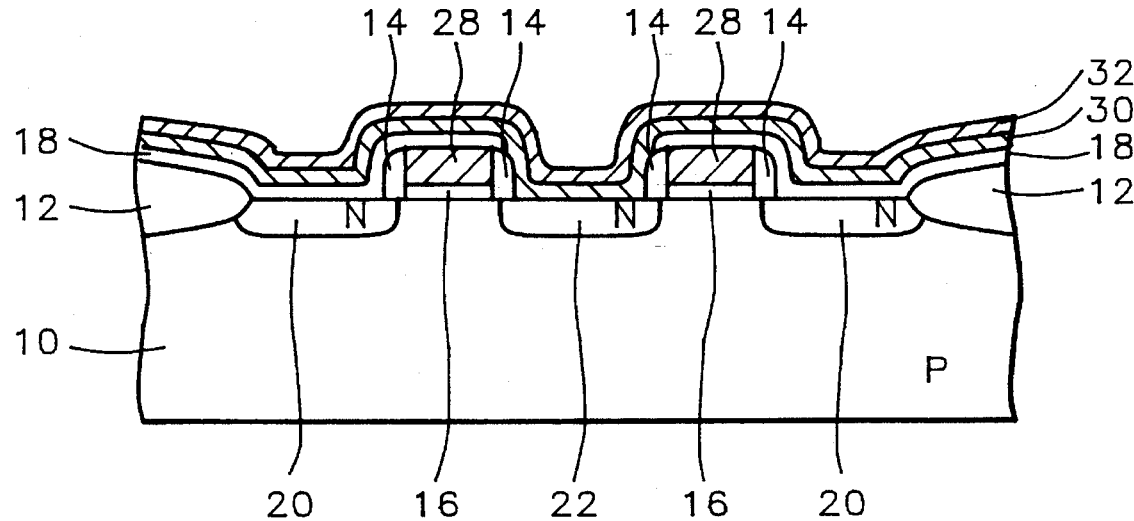
FIG. 1C – Prior Art

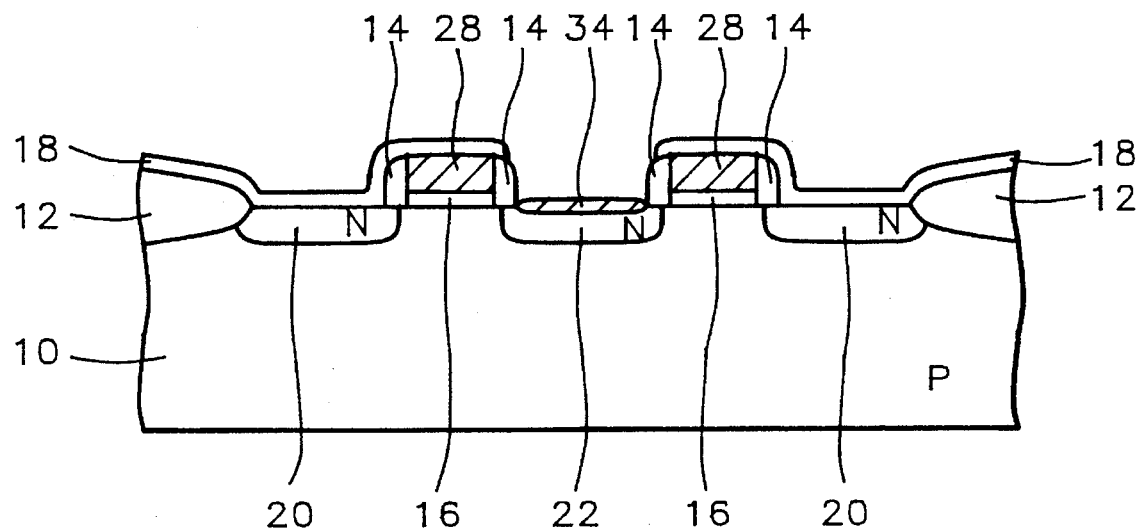
FIG. 1D – Prior Art
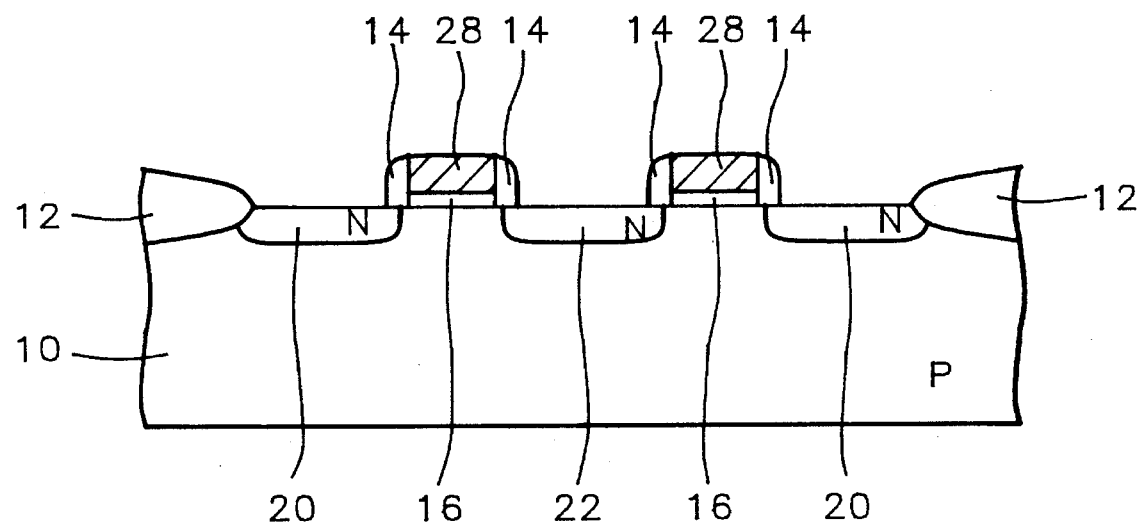
FIG. 2
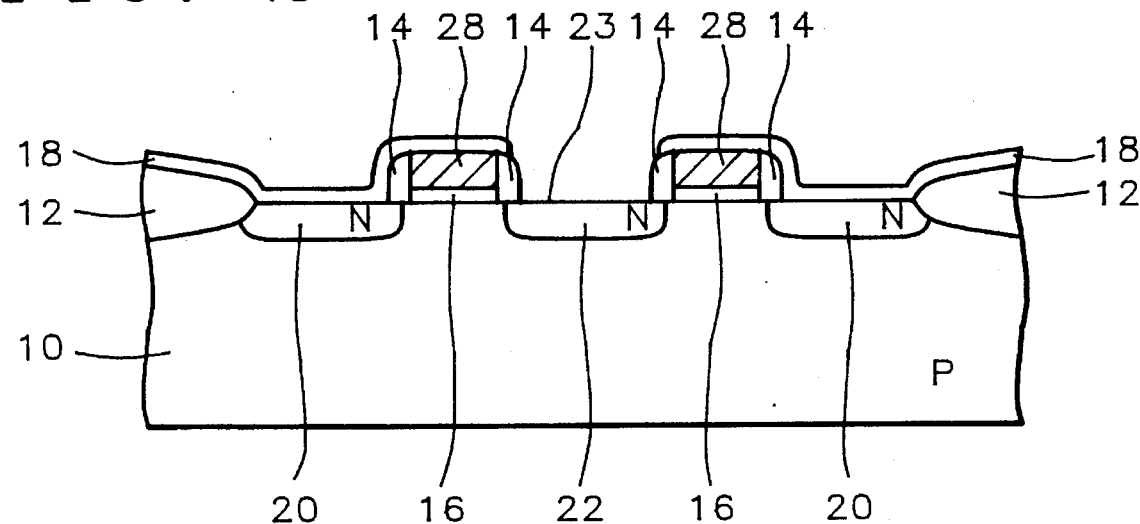
FIG. 3

:5,573,980

METHOD OF FORMING SALICIDED SELF-ALIGNED CONTACT FOR SRAM CELLS

BACKGROUND OF THE INVENTION

1. Field of the Invention

This invention deals with the formation of low resistance self aligned silicide contacts to silicon devices and more particularly to the formation of self aligned silicide contacts forming the $V_{ss}$ plate of adjacent pull down transistors in static random access memory cells.

2. Description of the Related Art

There is often a need for low resistance contacts to areas of silicon or polysilicon in devices formed in silicon integrated circuit substrates. Metal silicides have been widely used to form low resistance contacts and self-aligned silicide contacts provide an additional advantage.

Self aligned silicide contacts, or salicide contacts, are described in "SILICON PROCESSING FOR THE VLSI ERA", Volume 2, by S. Wolf, Lattice Press, Sunset Beach, Calif. 1990, pages 144–149.

Self aligned silicide contacts are also described in "VLSI TECHNOLOGY", Second Edition, by S. M. Sze, McGraw-Hill, New York, N.Y. 1988, pages 397–400 and 479–483.

In the methods described by Wolf and by Sze contact openings are formed in an oxide layer exposing silicon device regions or polysilicon electrode regions. The metal used to form the silicide is deposited on the substrate covering the exposed areas. The wafer is then heated causing the silicide reaction to take place in those regions where the metal is in contact with the silicon. The unreacted metal is then selectively etched and the contact is formed.

One of the problems encountered in conventional methods of forming self aligned silicide contacts is the formation of metal silicide stringers in regions where the metal is to be removed. Overetching is often required to remove the stringers.

The method of this invention forms self aligned silicide contacts using a method which avoids the formation of stringers.

SUMMARY OF THE INVENTION

Many applications for integrated circuits call for very low resistance contacts between metal wiring layers and device regions. A primary application for such low resistance contacts is a low resistance $V_{ss}$ plate for adjacent pull down transistors in Static Random Access Memory, or SRAM, cells. One method of forming low resistance contacts are self-aligned silicide contacts, often referred to as salicide contacts, described in the previously cited "SILICON PROCESSING FOR THE VLSI ERA", Volume 2, by S. Wolf, Lattice Press, Sunset Beach, Calif. 1990, pages 144–149 and in the previously cited "VLSI TECHNOLOGY", Second Edition, by S. M. Sze, McGraw-Hill, New York, N.Y. 1988, pages 397–400 and 479–483. In this method contact openings are formed in an oxide layer exposing silicon device regions or polysilicon electrode regions. The metal used to form the silicide is deposited and the wafer is heated causing the silicide reaction to take place in those regions where the metal is in contact with the silicon. The unreacted metal is then selectively etched and the contact is formed.

Refer to FIGS. 1A–1D for an example of a conventional method used to form low resistance self-aligned silicide contacts in SRAM cells. FIG. 1A shows a cross section of two adjacent N channel metal oxide semiconductor field effect transistors, NMOS-FETs, formed in a silicon substrate 10. Although N channel MOS-FET's will be described, the description applies equally to P channel MOS-FETs. The two NMOS devices have separate drains 20, separate gate electrodes 28, separate gate oxide regions 16, and share a common source 22. Oxide spacers 14 are formed at the sidewalls of the gate electrodes 28. Field oxide regions 12 provide isolation from the rest of the devices in the integrated circuit. A low resistance $V_{ss}$ contact to the common source 22 is required.

As shown in FIG. 1B, an oxide layer 18 is then formed on the silicon substrate and a contact opening is formed directly over the common source 22 so that the common source 22 is exposed and the oxide layer 18 covers the gate electrodes 18 and the drains 20. As shown in FIG. 1C, a very thin layer of polysilicon 30, with a thickness of between about 450 and 650 Angstroms is then deposited and patterned using photolithography and etching over the substrate 10 and a layer of metal 32, such as tungsten or titanium, with a thickness of between about 600 and 1800 Angstroms is formed over the patterned layer of polysilicon 30.

As shown in FIG. 1D, the silicon substrate is then heated and metal silicide 34 forms at the interface between the exposed source region 22 and the metal 32 and polysilicon 30. The unreacted metal is then etched away and a self-aligned metal silicide contact is formed to the source region. One problem with the conventional method is the formation of polycide stringers, or stray filaments of metal silicide which are difficult to remove. The polycide stringers cause a significant problem because if they are left in place they can cause stray conduction paths and if the etch time is sufficiently increased to remove the stringers damage to the contact region, in this example the source region 22, can occur.

It is an object of this invention to provide a method of forming low resistance metal silicide contacts for $V_{ss}$ contacts to a common source for adjacent MOS devices in SRAM arrays without the formation of polycide stringers.

It is another object of this invention to provide a method of forming low resistance metal silicide contacts for devices in a silicon substrate without the formation of polycide stringers.

These objectives are achieved by depositing a thin layer of polysilicon 30, having a thickness of between about 450 and 650 Angstroms, on the oxide layer formed on the silicon substrate 18 after the contact openings have been formed in the oxide layer exposing the contact region of the silicon substrate 22, see FIG. 1C. The thin layer of polysilicon is then patterned using the $V_{ss}$ interconnect mask, photolithographic techniques and etching. A layer of metal is then formed over the silicon substrate covering the remaining part of the thin polysilicon layer. The metal layer, the remaining part of the thin polysilicon layer, and the contact region are subjected to rapid thermal annealing thereby forming metal silicide at the interface of the metal layer, the remaining part of the thin polysilicon layer and the contact region. The unreacted metal silicide is then etched away and a second rapid thermal annealing is performed. This forms a low resistance contact over the entire contact region.

BRIEF DESCRIPTION OF THE DRAWINGS

FIG. 1A shows a cross section view of two adjacent MOS-FETs in a silicon integrated circuit substrate, having a common source, independent drains, and independent gates.

FIG. 1B shows a cross section view of the two adjacent MOS-FETs in a silicon substrate with an oxide layer having a contact opening formed on the silicon substrate.

FIG. 1C shows a cross section view of the two adjacent MOS-FETs in a silicon substrate having a layer of polysilicon and a layer of metal formed on the silicon substrate to form the conventional self aligned silicide contact.

FIG. 1D shows a cross section view of the two adjacent MOS-FETs in a silicon substrate after the conventional self aligned silicide contact has been formed at the common source of the two adjacent MOS-FETs.

FIG. 2 shows a cross section view of two adjacent MOS-FETs in a silicon integrated circuit substrate, having a common source, independent drains, and independent gates.

FIG. 3 shows a cross section view of the two adjacent MOS-FETs in a silicon substrate with an oxide layer having a contact opening formed over the substrate.

DESCRIPTION OF THE PREFERRED EMBODIMENTS

Figure 4:
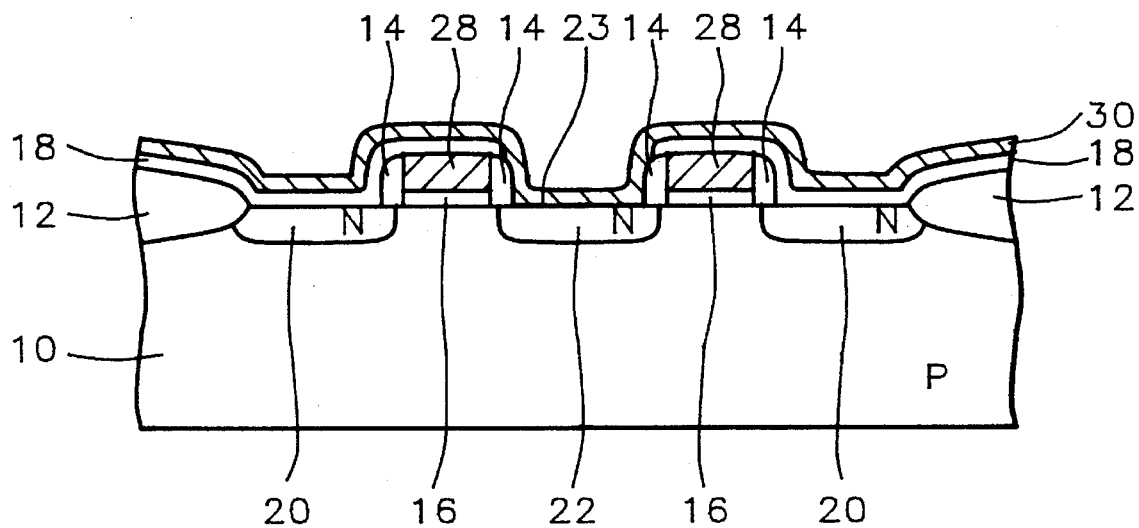
FIG. 4 shows a cross section view of the two adjacent MOS-FETs in a silicon substrate with a layer of polysilicon formed over the substrate.

Refer now to FIGS. 2–8, there is shown an embodiment of the method of forming silicide contacts of this invention. FIG. 2 shows a cross section of a silicon integrated circuit substrate 10 with two adjacent N channel metal oxide semiconductor field effect transistors, NMOS-FETs, having independent drains 20, independent gate electrodes 28, independent gate oxide regions 16, and a common source 22. Oxide spacers 14 are formed on the sidewalls of the gate electrodes 28. Field oxide regions 12 isolate the two adjacent NMOS-FETs from the remainder of the devices in the integrated circuit substrate. The NMOS-FETs described here are pull down transistors for a static random access memory, SRAM, however is will be obvious to anyone skilled in the art that the method works equally well for other type devices or in other applications.

In this embodiment it is desired to form a very low resistance contact to the common source 22 thereby forming a $V_{ss}$ plate on the common source 22. A first dielectric layer 18, in this embodiment $SiO_2$ having a thickness of between about 1000 and 1500 Angstroms, is formed on the silicon substrate 10. As shown in FIG. 3, that part of the $SiO_2$ layer covering the common source 22 is etched away using standard photolithographic techniques leaving a layer of $SiO_2$ 18 on the remainder of the substrate 10. After etching the layer of $SiO_2$ the surface 23 of the common source 22 is exposed and is the region where the contact is to be formed.

Figure 5:
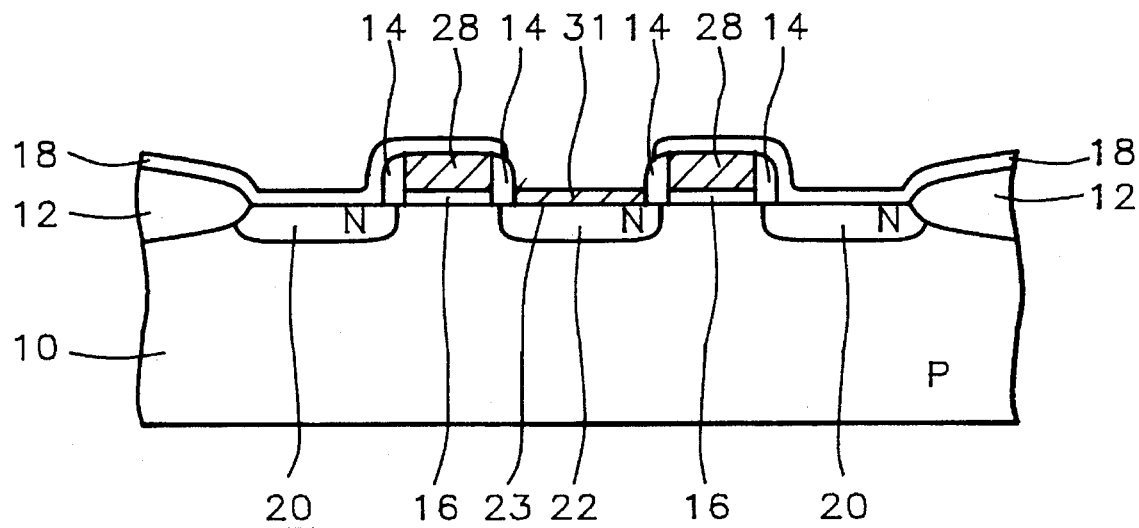
FIG. 5 shows a cross section view of the two adjacent MOS-FETs in a silicon substrate after the polysilicon layer has been etched back to cover only the contact region.

Next, as shown in FIG. 4, a thin layer of polysilicon, having a thickness of between about 450 and 650 Angstroms, is formed over the layer of $SiO_2$ 18 and the exposed surface 23 of the common source 22. The thin layer of polysilicon has a first polysilicon region covering the common source 22 and a second polysilicon region covering the remainder of the substrate. Next, as shown in FIG. 5, the second polysilicon region, or that part of the thin layer of polysilicon on the layer of $SiO_2$, is etched away leaving the first polysilicon region 31, or that part of the thin layer of polysilicon covering the surface 23 of the common source 22.

Figure 6:
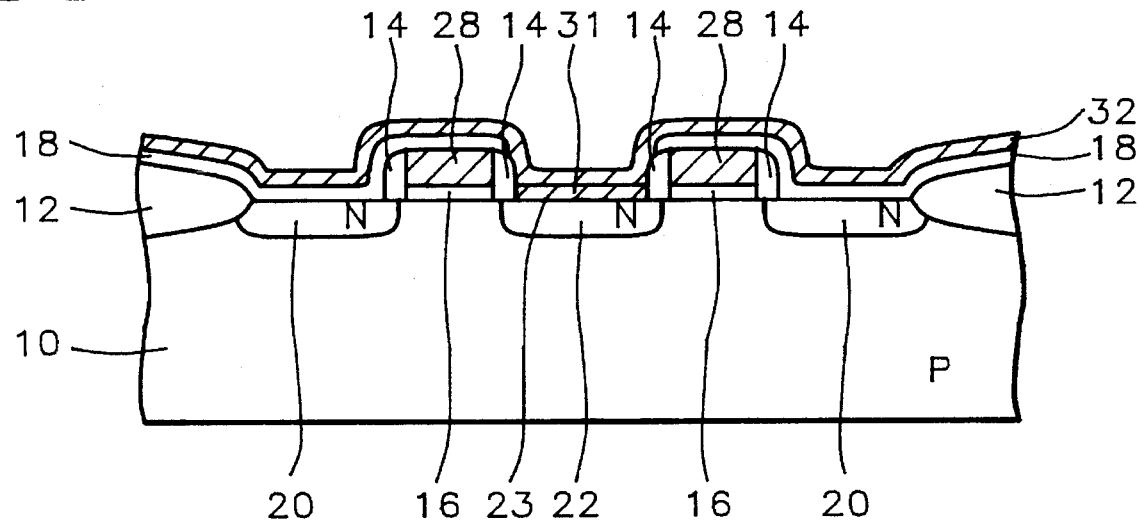
FIG. 6 shows a cross section view of the two adjacent MOS-FETs in a silicon substrate after a layer of metal has been formed over the substrate.

Next, as shown in FIG. 6, a layer of metal 32, in this embodiment titanium having a thickness of between about 500 and 1500 Angstroms, is formed on the substrate. The layer of titanium 32 has a first titanium region, that part of the layer titanium over the first polysilicon region 31, and a second titanium region, that part of the layer of titanium 32 which is not over the first polysilicon region 31. The substrate is then subjected to a first rapid thermal annealing wherein the temperature of the first polysilicon region 31, the first titanium region, and the surface 23 of the common source 22 are raised to between about 600° C. and 700° C. for between about 20 and 50 seconds. During the rapid thermal annealing the titanium in the first titanium region reacts with the silicon in the first polysilicon region 31 and the silicon in the common source 22 to form titanium silicide, $TiSi_2$.

Figure 7:
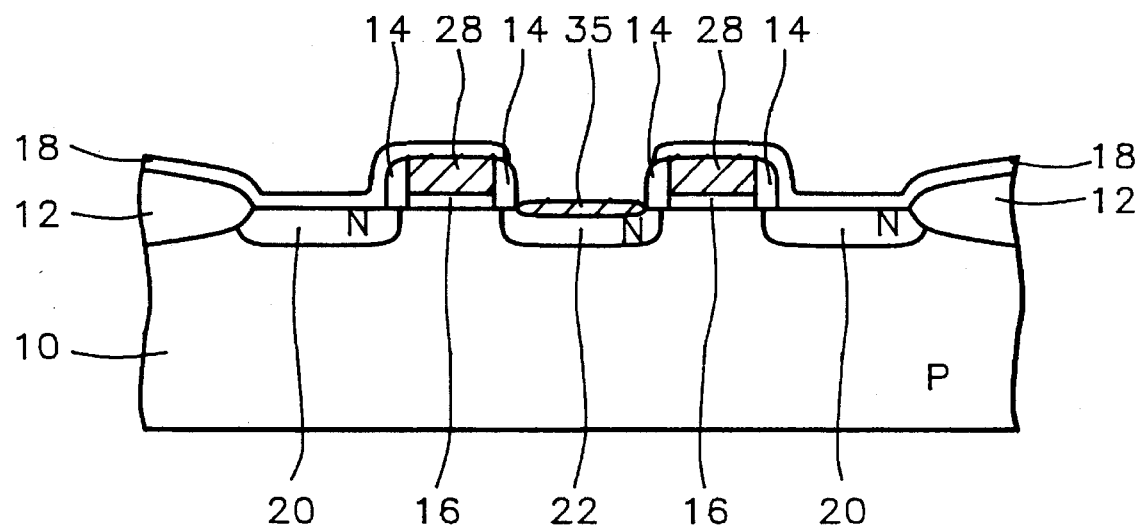
FIG. 7 shows a cross section view of the two adjacent MOS-FETs in a silicon substrate after rapid thermal annealing has formed metal silicide over the contact region and the unreacted metal has been etched away.

Next, as shown in FIG. 7, the unreacted layer of titanium is then etched away using an $NH_4OH$ solution, which will etch unreacted titanium but will not etch the $TiSi_2$, leaving a layer of $TiSi_2$ 35 over the common source 22. Next, the substrate is then subjected to a second rapid thermal annealing wherein the temperature of the layer of $TiSi_2$ 35 over the common source 22 and the common source 22 are raised to between about 650° C. and 780° C. for between about 20 and 60 seconds. The second rapid thermal annealing drives the $TiSi_2$ deeper into the common source 22 forming a very low resistance $V_{ss}$ plate at the common source 22.

Figure 8:
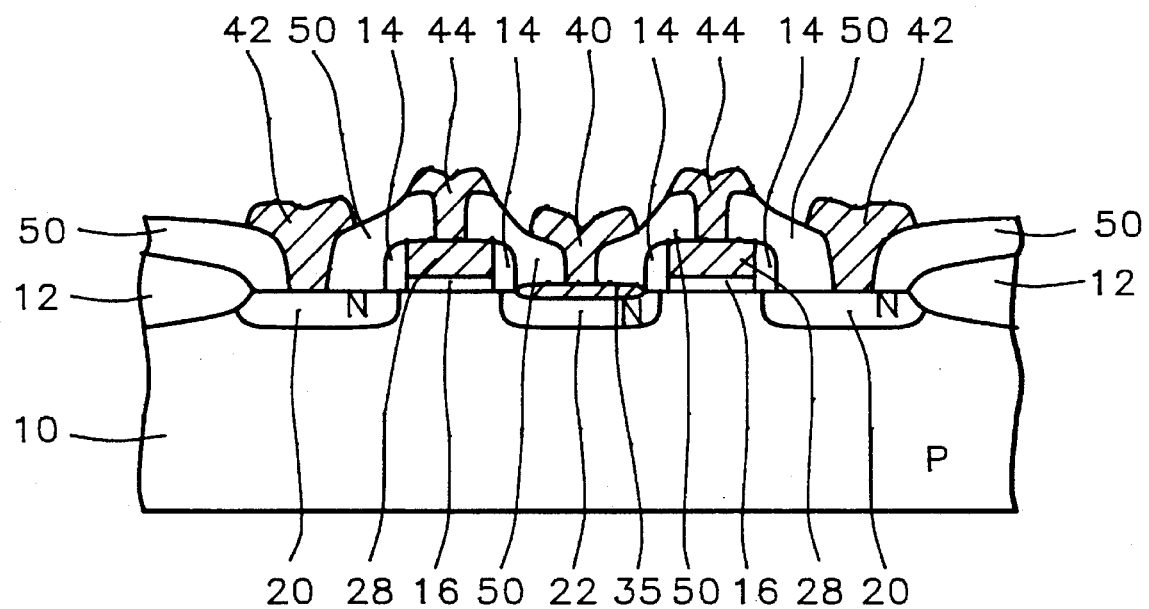
FIG. 8 shows a cross section view of the two adjacent MOS-FETs in a silicon substrate after an insulating dielectric layer has been formed and contact holes have been formed in the insulating dielectric layer and filled with metal.

Next, as shown in FIG. 8, a second dielectric layer 50, such as glass or the like, is formed over the substrate. Contact holes are formed in the second dielectric layer and filled with contact metal, such as aluminum or the like, to form a contact 40 for the $TiSi_2$ layer 35, contacts 42 for the independent drains 20, and contacts 44 for the gate electrodes.

The preceding embodiment uses the method of this invention to form a low resistance $V_{ss}$ plate of $TiSi_2$ for pull down NMOS-FETs. The method works equally well for any contacts to any silicon regions, such as sources or drains of PMOS-FETs, sources or drains of other type NMOS-FETs, or other type silicon devices.

While the invention has been particularly shown and described with reference to the preferred embodiments thereof, it will be understood by those skilled in the art that various changes in form and details may be made without departing from the spirit and scope of the invention.

What is claimed is:

1. A method of forming self-aligned silicide contacts, comprising the steps of:

providing a semiconductor substrate having devices and a first contact region formed therein;

providing a number of gate oxide regions formed on said semiconductor substrate;

providing a number of gate electrodes equal to the number of said gate oxide regions wherein each one of said gate electrodes is formed on one of said gate oxide regions;

forming a first dielectric layer on said semiconductor substrate covering said gate electrodes;

forming a first contact opening in said first dielectric layer directly over said first contact region thereby exposing said first contact region;

forming a layer of polysilicon having a first polysilicon region and a second polysilicon region on said semiconductor substrate after said first contact opening has been formed, thereby covering said first dielectric layer and said first contact region, wherein said first polysilicon region is that part of said layer of polysilicon directly over said first contact region and said second polysilicon region is the remainder of said layer of polysilicon;

etching away said second polysilicon region using photolithographic techniques;

forming a metal layer having a first metal region and a second metal region on said semiconductor substrate after etching away said second polysilicon region, thereby covering said first polysilicon region and said first dielectric layer, wherein said first metal region is that part of said metal layer covering said first polysilicon region and said second metal region is the remainder of said metal layer;

performing a first rapid thermal annealing of said first metal region, said first polysilicon region, and said first contact region thereby forming a metal silicide at the interface of said first polysilicon region and said first metal region;

stripping said second metal region; and performing a second rapid thermal annealing of said first metal region, said first polysilicon region, and said first contact region after stripping said second metal region;

forming a second dielectric layer on said semiconductor substrate after performing said second rapid thermal annealing;

forming a number of second contact openings in said second dielectric layer; and filling said second contact openings with contact metal.

2. The method of claim 1 wherein said first dielectric layer is silicon dioxide.

3. The method of claim 1 wherein said first dielectric layer has a thickness of between about 1000 and 1500 Angstroms.

4. The method of claim 1 wherein said layer of polysilicon has a thickness of between about 450 and 650 Angstroms.

5. The method of claim 1 wherein said metal layer is titanium.

6. The method of claim 1 wherein said metal layer has a thickness of between about 1200 and 1800 Angstroms.

7. The method of claim 1 wherein said metal silicide is titanium silicide.

8. The method of claim 1 wherein said first rapid thermal annealing is carried out at a temperature of between about 600° C. and 700° C. for between about 20 and 50 seconds.

9. The method of claim 1 wherein said second rapid thermal annealing is carried out at a temperature of between about 650° C. and 780° C. for between about 20 and 60 seconds.

10. The method of claim 1 wherein said gate electrodes are formed of polysilicon.

11. A method of forming self-aligned silicide contacts, comprising the steps of:

providing a semiconductor substrate having devices and a first contact region formed therein;

forming a first dielectric layer on said semiconductor substrate;

forming a first contact opening in said first dielectric layer directly over said first contact region thereby exposing said first contact region;

forming a layer of polysilicon having a first polysilicon region and a second polysilicon region on said semiconductor substrate after said first contact opening has been formed, thereby covering said first dielectric layer and said first contact region, wherein said first polysilicon region is that part of said layer of polysilicon directly over said first contact region and said second polysilicon region is the remainder of said layer of polysilicon;

etching away said second polysilicon region using photolithographic techniques;

forming a metal layer having a first metal region and a second metal region on said semiconductor substrate after etching away said second polysilicon region, thereby covering said first polysilicon region and said first dielectric layer, wherein said first metal region is that part of said metal layer covering said first polysilicon region and said second metal region is the remainder of said metal layer;

performing a first rapid thermal annealing of said first metal region, said first polysilicon region, and said first contact region thereby forming a metal silicide at the interface of said first polysilicon region and said first metal region;

stripping said second metal region; and performing a second rapid thermal annealing of said first metal region, said first polysilicon region, and said first contact region after stripping said second metal region;

forming a second dielectric layer on said semiconductor substrate after performing said second rapid thermal annealing;

forming a number of second contact openings in said second dielectric layer; and filling said second contact openings with contact metal.

12. The method of claim 11 wherein said first dielectric layer is silicon dioxide.

13. The method of claim 11 wherein said first dielectric layer has a thickness of between about 1000 and 1500 Angstroms.

14. The method of claim 11 wherein said layer of polysilicon has a thickness of between about 450 and 650 Angstroms.

15. The method of claim 11 wherein said metal layer is titanium.

16. The method of claim 11 wherein said metal layer has a thickness of between about 1200 and 1800 Angstroms.

17. The method of claim 11 wherein said metal silicide is titanium silicide.

18. The method of claim 11 wherein said first rapid thermal annealing is carried out at a temperature of between about 600° C. and 700° C. for between about 20 and 60 seconds.

19. The method of claim 11 wherein said second rapid thermal annealing is carried out at a temperature of between about 650° C. and 780° C. for between about 20 and 60 seconds.

\* \* \* \* \*